United States Patent
Kurata et al.

(10) Patent No.: US 6,437,231 B2
(45) Date of Patent: *Aug. 20, 2002

(54) INTEGRATED THIN-FILM SOLAR BATTERY AND METHOD OF MANUFACTURING THE SAME

(75) Inventors: Shinichiro Kurata; Katsuhiko Hayashi; Atsuo Ishikawa, all of Otsu; Masataka Kondo, Kobe, all of (JP)

(73) Assignee: Kanegafuchi Kagaku Kogyo Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/863,351

(22) Filed: May 24, 2001

Related U.S. Application Data

(63) Continuation of application No. 09/033,933, filed on Mar. 3, 1998, now Pat. No. 6,265,652, which is a continuation-in-part of application No. 08/661,327, filed on Jun. 13, 1996, now abandoned.

(30) Foreign Application Priority Data

Jun. 15, 1995 (JP) ............................................. 7-148847

(51) Int. Cl.⁷ ...................... H01L 27/142; H01L 31/05; H01L 31/042
(52) U.S. Cl. ...................... 136/244; 136/256; 136/258; 136/261; 257/443; 438/68; 438/72; 438/80; 438/66; 438/69
(58) Field of Search ................................. 136/244, 256, 136/258, 261; 257/443; 438/68, 72, 80, 66, 69

(56) References Cited

U.S. PATENT DOCUMENTS

| | | | | |
|---|---|---|---|---|
| 4,542,578 A | * | 9/1985 | Yamano et al. | 136/244 |
| 4,663,494 A | * | 5/1987 | Kishi et al. | 136/244 |
| 4,754,544 A | * | 7/1988 | Hanak | 136/244 |
| 4,755,475 A | * | 7/1988 | Kiyama et al. | 136/244 |
| 6,265,652 B1 | * | 7/2001 | Kurata et al. | 136/244 |

FOREIGN PATENT DOCUMENTS

| | | | |
|---|---|---|---|
| DE | 3714920 | * | 7/1988 |
| DE | 37 14920 C1 | | 7/1988 |
| EP | 113959 | * | 7/1984 |
| EP | 0113 959 A2 | | 7/1984 |
| EP | 749161 | * | 12/1996 |
| JP | 55-10870 | * | 8/1980 |
| JP | 2-237081 A | * | 9/1990 |
| JP | 2-237081 | * | 9/1990 |
| JP | 6-5897 | * | 1/1994 |
| JP | 6-104465 | * | 4/1994 |

OTHER PUBLICATIONS

Patent Abstracts of Japan, Publication No. 55108780, Aug. 21, 1980, corresponding to JP 55108780A.

* cited by examiner

*Primary Examiner*—Alan Diamond
(74) *Attorney, Agent, or Firm*—Armstrong, Westerman & Hattori, LLP

(57) ABSTRACT

An integrated thin-film solar battery having a plurality of unit elements connected in series includes a substrate, a plurality of spaced apart first electrode layers formed on the substrate; a plurality of semiconductor layers disposed on said plurality of first electrode layers in such a manner that each of the semiconductor layers is formed on two adjacent first electrodes and has a connection opening located on one of the two first electrodes, an electrically conductive layer formed on each of the semiconductor layers except on the region of the connection opening, and a second electrode layer disposed on each of the electrically conductive layers such that the second electrode layer is electrically connected to one of the two adjacent first electrode layers through the connection opening, to form a region interposed between the second electrode layer and the other first electrode layer as the unit element.

22 Claims, 2 Drawing Sheets

INTEGRATED THIN-FILM SOLAR BATTERY AND METHOD OF MANUFACTURING THE SAME

This application is a continuation of U.S. application Ser. No. 09/033,933, filed Mar. 3, 1998, now U.S. Pat. No. 6,265,652 which is a continuation-in-part of U.S. application Ser. No. 08/661,327, filed Jun. 13, 1996, now abandoned.

BACKGROUND OF THE INVENTION

1. Field of the Invention

The present invention relates to a method of manufacturing an integrated thin-film solar battery by forming a plurality of unit elements connected to each other on a substrate and an integrated thin-film solar battery manufactured by that method, and more particularly to an improvement in the electrical characteristics of the solar battery by improving the quality of an interface between a semiconductor layer and an electrode layer at a side opposite the light receiving surface, thereby realizing an integrated thin-film solar battery with a high output.

2. Description of the Related Art

The use of solar batteries that convert energy of solar light directly into electrical energy has been now started on a large scale, and crystal-based solar batteries exemplified by single-crystal silicon, polycrystal silicon or the like have already been put into practical use as an outdoor power solar battery. On the other hand, attention has been drawn to a thin-film solar battery such as of amorphous silicon as an inexpensive solar battery because the cost of raw materials used therefor is reduced. However, in general, such a thin-film solar battery is still being developed, and extensive research and development have been conducted in order to develop the thin-film solar battery into a solar battery used outdoors on the basis of the experience of using the thin-film solar battery as a power supply for consumer electronic devices such as calculators.

The thin-film solar battery, as in conventional thin film devices, is manufactured by a process in which the deposition of thin films using CVD sputtering or the like, and patterning of the thin films are repeated so as to obtain a desired structure. There is normally adopted an integrated structure in which a plurality of unit elements are connected in series or parallel on a single substrate. The power solar battery for use outdoors requires a large area substrate that exceeds, for example, 400×800 (mm).

FIG. 2 is a cross-sectional view showing the structure of the above-mentioned conventional thin-film solar battery. This structure of an integrated thin-film solar battery has been generally used up to now, in which each unit element 15 has a first electrode layer 5, a semiconductor layer 9 made of an amorphous silicon or the like, and a second electrode layer 13, which are stacked one on another in the stated order. The unit elements 15 adjacent to each other are connected in series through a connection opening 7 formed in the semiconductor layer 9. The first electrode layer 5 is usually formed of a transparent electrically conductive film made of, for example, tin oxide ($SnO_2$), zinc oxide ZnO), or indium tin oxide (ITO), and the second electrode layer 13 is formed of a metal film made of, for example, aluminum (Al), silver (Ag), or chromium (Cr).

The above-mentioned conventional integrated thin-film solar battery is manufactured by a method which will be described hereinafter with reference to FIG. 2. On a glass substrate 3, the transparent electrically conductive film made of $SnO_2$, ZnO, or ITO is deposited as the first electrode layer 5, and the first electrode layer 5 is divided into a plurality of sections corresponding to the power generation regions by laser-scribing. Then, a cleaning of the first electrode layer 5 is conducted in order to remove the debris melted and cut off by the laser-scribing. A semiconductor layer 9 made of amorphous silicon with a p-i-n junction structure is deposited on the overall surface of the first electrode layer 5 through a plasma CVD technique. Subsequently, as with the first electrode layer 5, after the semiconductor layer 9 has been divided into a plurality of sections through the laser scribing technique, the semiconductor layer 9 is cleaned in order to remove the debris melted and cut off by the laser-scribing. Each of the plurality of semiconductor layer 9 sections are formed on top of the substrate 3 and the first electrode layer 5 so as to bridge at least two adjacent sections of the plurality of first electrode layer 5 sections. The connector opening 7 (e.g. a VIA hole) is etched in each of the semiconductor layer 9 sections in the vicinity of an adjacent first electrode layer 5 section bridged by the semiconductor layer 9.

Further, as the second electrode layer 13, a metal film made of Al, Ag, Cr or the like is deposited on the semiconductor layer 9 as a single layer or a plurality of layers, and divided into a plurality of sections 13 through the laser scribing technique as with the first electrode layer 5. The second electrode layer 13 contacts the first electrode layer 5 through the connector opening 7 in each of the semiconductor layer 9 sections when filled in with the second electrode layer 13 material, thus completing an integrated thin-film solar battery having a large area.

However, in the above-mentioned conventional integrated thin-film solar battery, it is found that the fill factor (FF value) of its output characteristics is low. Generally, in the manufacture of the integrated thin-film solar battery, the individual cell parameters such as the thickness of the respective electrode layers 5 and 13 or the quality of the semiconductor layer 9 are optimized in order to improve the characteristics. Since the large area of the substrate 3 makes experiments for optimizing the individual process conditions complicated, experimental thin-film solar batteries having a small area are normally manufactured through an easy process as preceding experiments, for evaluating the characteristics obtained thereby. Then, the optimum conditions of the individual processes obtained by the above manner are incorporated the process of manufacturing a thin-film solar battery having a large area.

However, although excellent numerical values may be obtained by the preceding experiments, when the optimum conditions thereof are incorporated in the process of manufacturing a thin-film solar battery having a large area, excellent results as good as the numerical values obtained by the preceding experiment cannot be obtained, and most of the results are lower in FF value. Hence, an improvement in the above-mentioned FF value is indispensable and urgently required for integrated thin-film solar batteries having a large area, in order to improve the conversion efficiency.

Under these circumstances, the present inventors have studied in detail the cause of the lowering of the FF value, with the result that they have proved that the interface between the semiconductor layer 9 and the second electrode layer 13 causes the FF value to be lowered.

FIG. 3 shows a cross-sectional structure of a thin-film solar battery having a small area, used in the above-mentioned preceding experiments. The thin-film solar battery having a small area is obtained in such a manner that a first electrode layer 5 made of $SnO_2$, ZnO, ITO or the like, a semiconductor layer 9 made of an amorphous silicon or the like, and a second electrode layer 13 made of Al, Ag, Cr or the like are stacked on a substrate 3 in the stated order, and patterning of the periphery of the second electrode layer 13 and the semiconductor layer 9 is conducted. The characteristics of the solar battery are then measured by placing a measuring probe on an exposed portion 5a of the first electrode layer 5 and the second electrode layer 13. The thin film solar battery having a small area is not subjected to a cleaning processing since the semiconductor layer 9 is deposited on the substrate 3 before the second electrode layer 13 is deposited thereon, the first electrode layer 5, the semiconductor layer 9, and the second electrode layer 13 being continuously successively formed. In other words, it has been proved that the interface between the semiconductor layer 9 and the second electrode layer 13 absorbs moisture, etc., and the generation of a natural oxide film on the amorphous silicon surface occurs, with the result that the FF value is lowered. However, in the case of the integrated thin-film solar battery having a large area, because the laser scribing technique is applied for patterning, debris melted and cut off by the laser-scribing unavoidably occur. Unless the debris are removed, the adhesion of the second electrode layer 13 and the first electrode layer 5 in the connecting opening 7 is degraded. This adversely affects the characteristics and reliability of the solar battery more than the lowering of the FF value. Hence, the cleaning processing for removing the debris melted and cut off by laser-scribing is essential in the process of manufacturing the integrated thin-film solar battery having a large area.

The above-mentioned conventional method makes it impossible to improve the FF value while conducting the cleaning processing.

SUMMARY OF THE INVENTION

The present invention has been made in view of the above circumstances, and therefore an object of the present invention is to provide an integrated thin-film solar battery having a structure which has an improved FF value while still being subjected to the cleaning processing, and a method of manufacturing the same.

In order to solve the above problem, the present invention has been achieved by the provision of an integrated thin-film solar battery having a plurality of unit elements connected in series, in which a plurality of semiconductor layers are disposed on a plurality of first electrode layers which are divided into a plurality of regions on a substrate in such a manner that each of the semiconductor layers is formed on two adjacent first electrodes and has a connection opening on one of the two first electrodes, an electrically conductive layer is formed on each of the semiconductor layers except for the region of the connection opening, a second electrode layer is disposed on each of the electrically conductive layers such that the second electrode layer is electrically connected to one of the two adjacent first electrode layers through the connection opening, to thereby form a region interposed between the second electrode layer and the other first electrode layer as the unit element.

In this example, the electrically conductive layer may be made of a transparent electrically conductive film material mainly containing tin oxide, zinc oxide, or indium tin oxide.

Also, the above-mentioned integrated thin-film solar battery can be manufactured by a method in which, after a plurality of first electrode layers corresponding to a plurality of power generation regions have been formed on a substrate, a plurality of semiconductor layers each having a connection opening that permits a part of each first electrode layer to be exposed therefrom and a plurality of electrically conductive layers are formed on the plurality of semiconductor layers of the plurality of power generation regions, and after a second electrode layer has been formed on the electrically conductive layers, the second electrode layer is divided into a plurality of sections corresponding to the plurality of power generation regions by removing at least the second electrode layer and the electrically conductive layers in the vicinity of each of the connection openings, to thereby form a plurality of unit elements connected in series, each being formed of a region interposed between each first electrode layer and the second electrode layer, on the substrate.

In this example, the electrically conductive layers may be made of a transparent electrically conductive film material mainly containing tin oxide, zinc oxide, or indium tin oxide.

The above-mentioned integrated thin-film solar battery is so designed that the first electrode layer is divided into a plurality of regions on the substrate via the conventional method, the semiconductor layer is formed into a plurality of regions in such a manner that each of the semiconductor layers is formed on two adjacent first electrodes and has a connection opening on one of the two first electrodes, the electrically conductive layer(s) are formed on each of the semiconductor layers except in the region of the connection opening, and the second electrode layer is disposed on each of the electrically conductive layers such that the second electrode layer is electrically connected to one of the two adjacent first electrode layers through the connection opening. With such a structure, there are formed a plurality of unit elements connected in series, each being formed by a region interposed between the second electrode layer and the other first electrode layer.

The thin-film solar battery of the present invention is of a structure in which the connection opening can be defined by the laser scribing technique after the semiconductor layer and the electrically conductive layer(s) are sequentially deposited, since the electrically conductive layer(s) is (are) formed on the semiconductor layer except for the region of the connection opening as described above. That is, the thin-film solar battery of the invention is of a structure such that it can be manufactured without the semiconductor layer being in direct contact with water used for cleaning or external air. Hence, in the integrated thin-film solar battery of the present invention, the natural oxide film derived from the cleaning process is not generated on the surface of the semiconductor layer.

In this example, when the electrically conductive layer is made of a transparent electrically conductive film material such as $SnO_2$, ZnO, or ITO, no natural oxide film is produced on its surface by the cleaning process, and the interface between the electrically conductive layer(s) and the second electrode layer is also maintained in an excellent state. Furthermore, alloying does not occur between the electrically conductive layer and the semiconductor layer. Hence, any factors that lead to the degradation of the FF value can be more completely removed.

The method of manufacturing the thus structured integrated thin-film solar battery is as follows.

First, the first electrode layer is formed on the substrate so as to correspond to the desired plurality of power generation regions. A transparent electrically conductive film made of $SnO_2$, ZnO, ITO or the like is deposited on the substrate, and for integration, the first electrode layer is then melted and segmented in correspondence with the desired plurality of power generation regions via the laser scribing technique. Subsequently, a cleaning process such as water-washing is conducted on the first electrode layer in order to remove the debris melted and cut off by laser-scribing. Although moisture is attracted onto the surface of the first electrode layer through the cleaning process, a natural oxide film is not produced thereon because the first electrode layer is a metal oxide.

Subsequently, the plurality of semiconductor layers each having a connection opening that permits a part of each first electrode layer to be exposed therefrom and the plurality of electrically conductive layers are sequentially formed on the first electrode layers of the plurality of power generation regions by the plasma CVD technique. The semiconductor layer is formed of an amorphous silicon layer having, for example, a p-i-n junction structure, and the electrically conductive layer may be made of $SnO_2$, ZnO, ITO or the like. In the formation of the connection opening, after both the semiconductor layer and the electrically conductive layer have been deposited, they are melted and segmented through the laser scribing technique, to thereby form the connecting opening in a groove shape.

Similarly, a cleaning process such as water-washing is conducted in order to remove the debris melted and cut off by laser-scribing. In this situation, the semiconductor layer is not in direct contact with water because its surface is covered with the electrically conductive layer, with the result that a natural oxide film derived from the cleaning process is not generated on the surface of the semiconductor layer. Although moisture is attracted onto the surface of the electrically conductive layer, a natural oxide film is not produced thereon if the electrically conductive layer is made of a metal oxide such as $SnO_2$, ZnO or ITO. Hence, the electrically conductive layer functions as a protective layer for the semiconductor layer.

Subsequently, after the second electrode layer made of Al, Ag, Cr or the like has been formed on the electrically conductive layers, the second electrode layer is divided in correspondence with the desired plurality of power generation regions by removing at least the second electrode layer and the electrically conductive layer in the vicinity of each of the connection openings, to thereby form a plurality of unit elements connected in series, each being formed of a region interposed between each first electrode layer and the second electrode layer, on the substrate. Similarly, the second electrode layer and the electrically conductive layer are removed through the laser scribing technique, and a cleaning process such as water-washing is conducted in order to remove the debris melted and cut off by laser-scribing.

As described above, in the manufacturing method of the present invention, since the semiconductor layer is not in direct contact with cleaning water or external air, the interface between the semiconductor layer and the second electrode layer is improved in quality, thereby contributing to an improvement in FF value of the solar battery.

It is preferable that a semiconductor layer doped with hydrogen is used as a semiconductor layer contacting with an electrically conductive layer. Because a part of the electrically conductive layer contacting with the semiconductor layer is reduced, with a resulting improvement in electric connection, the FF value is heightened.

It is also preferable that electric resistivity of the electrically conductive layer comprising a transparent metal oxide material is set in a range of $5\times10^{-4}$ Ω·cm to $4\times10^{-3}$ Ω·cm to achieve a heightened FF value. When the electrical conductivity is outside the above-described preferred range, the FF value is lowered. In particular, when the electric resistivity of the electrically conductive layers is less than $5\times10^{-4}$ Ω·cm, ingredients of the electrically conductive layers and the second electrode layers are mutually diffused so that a kind of alloy is generated. As a result, the FF value is lowered. In addition, when the electric resistivity of the electrically conductive layers is more than $4\times10^{-3}$ Ω·cm, a series resistance of the thin-film solar battery is heightened and the FF value is also consequently lowered.

The above and other objects and features of the present invention will be more apparent from the following description taken in conjunction with the accompanying drawings.

DESCRIPTION OF THE PREFERRED EMBODIMENTS

Hereinafter, a description will be given in more detail of a specific embodiment of the present invention with reference to the accompanying drawings.

First Embodiment

Figure 1:
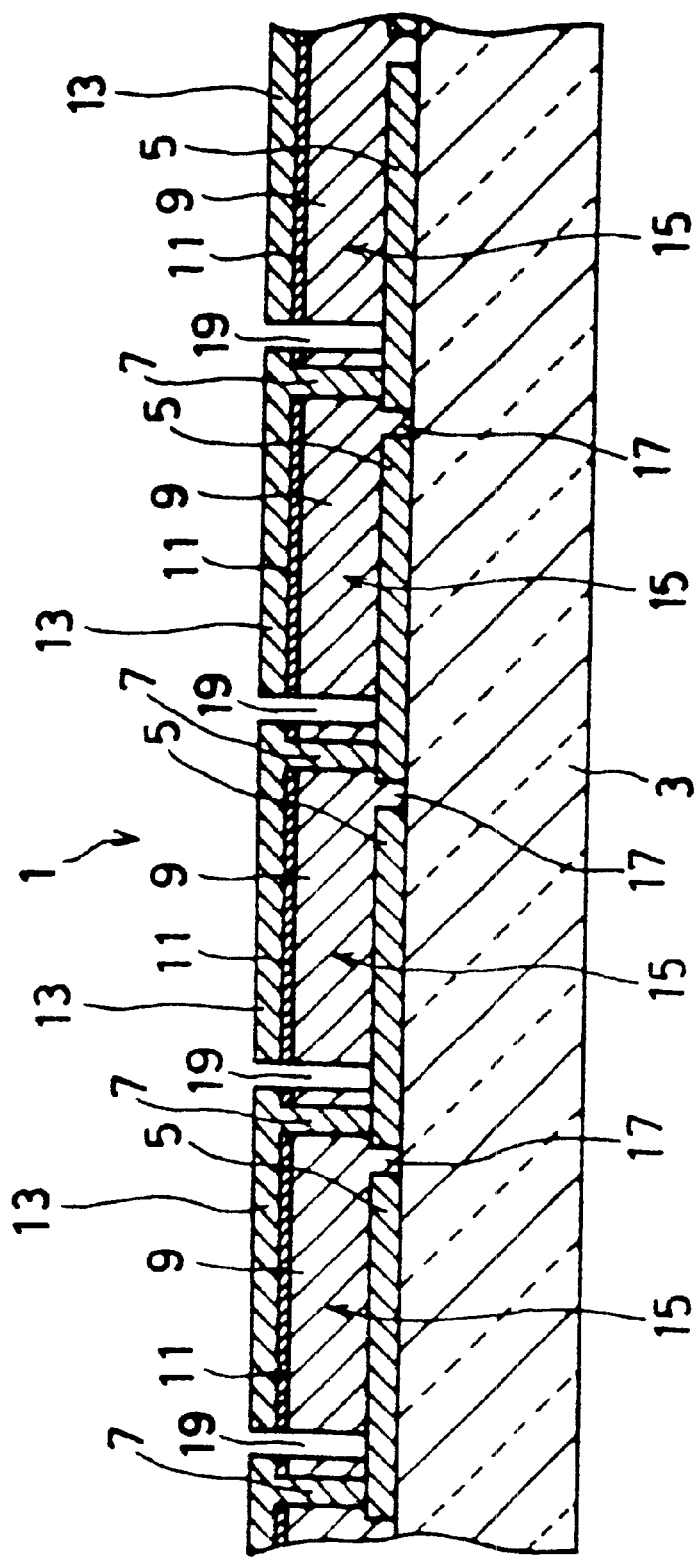
FIG. 1 is a cross-sectional diagram showing the structure of an integrated thin-film solar battery in accordance with the present invention.
Figure 2:
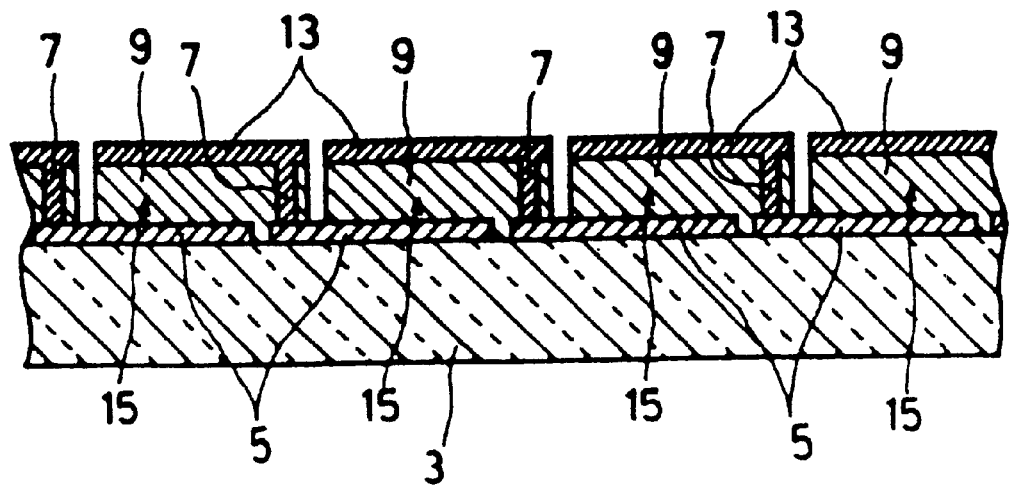
FIG. 2 is a cross-sectional diagram showing the structure of a conventional integrated thin-film solar battery.
Figure 3:
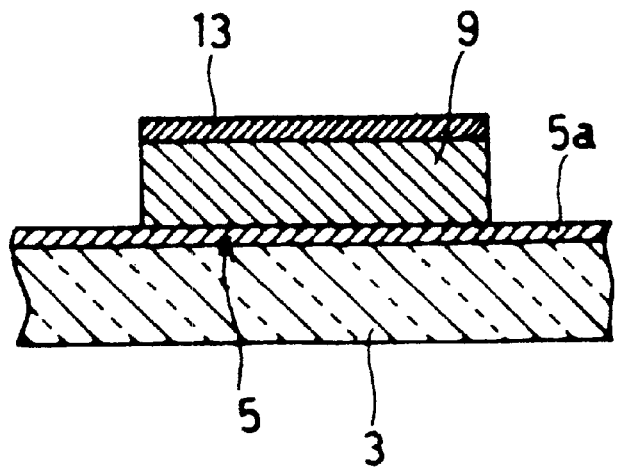
FIG. 3 is a cross-sectional diagram showing a thin-film solar battery having a small area, used for studying the process conditions for manufacturing the integrated thin-film solar battery.

FIG. 1 shows the cross-sectional structure of an example of an integrated thin-film solar battery 1 in accordance with the present invention. The integrated thin-film solar battery 1 comprises a plurality of unit elements 15 connected in series. In the integrated thin-film solar battery 1, a plurality of semiconductor layers 9 are disposed on a plurality of first electrode layers 5 which form a plurality of regions on a substrate 3 in such a manner that each of the semiconductor layers 9 is formed on two adjacent first electrodes 5 and has a connection opening 7 on one of the two first electrodes 5. An electrically conductive layer 11 is formed on each of the semiconductor layers 9 except for the region of connection opening 7. A second electrode layer 13 is disposed on each electrically conductive layer 11 such that the second electrode layer 13 is electrically connected to one of the two electrode layers 5 through the connection opening 7, thereby forming, as the unit element 15, a region interposed between the second electrode layer 13 and the other first electrode layer 5. Hereinafter, a description will be given in more detail of a method of manufacturing the above-mentioned integrated thin-film solar battery with reference to FIG. 1.

A transparent electrically conductive film made of $SnO_2$, ZnO, ITO or the like is deposited on the glass substrate 3 as the first electrode layer 5, and for integration, the first electrode layer 5 is then melted and segmented in correspondence with the desired plurality of power generation regions via the laser scribing technique, to thereby form a plurality of separation grooves 17. In the case of an integrated thin-film solar battery having a large area, for example, a plurality of strip-shaped power generation regions are formed along one direction of the substrate 3. In the case of the integrated thin-film solar battery having a large area, as one example, a hazy substrate of 910×455×4 (mm) is used, and the surface resistance of the first electrode layer 5 is set at 10 ohms. Subsequently, cleaning of the first electrode layer 5 is conducted in order to remove the debris melted and cut off by the laser-scribing. An amorphous silicon hydride semiconductor layer having a p-i-n structure is deposited on the entire surface of the first electrode layers 5 corresponding to the plural power generation regions via the plasma CVD technique. The amorphous silicon hydride layer is produced in the manner described below.

First, the substrate 3 is introduced into a high vacuum chamber of $10^{-5}$ Torr or less, and silane ($SiH_4$), diborane ($B_2H_6$), and methane ($CH_4$) are then introduced into the chamber as film formation gases under a substrate temperature of 140 to 200° C. The reaction pressure is set to approximately 1.0 Torr, and a p-type amorphous silicon hydride carbide layer is deposited to a thickness of 50 to 200 Å through RF discharge. Thereafter, only silane gas is introduced into the chamber as the film formation gas, and the reaction pressure is set to 0.2 to 0.7 Torr, and an i-type amorphous silicon hydride layer is deposited to a thickness of approximately 3000 Å through RF discharge. Next, silane, phosphine (PH3), and hydrogen ($H_2$) are introduced into the chamber as film formation gases, the reaction pressure is set to approximately 1.0 Torr, and an n-type microcrystal silicon layer is deposited to a thickness of approximately 100 to 200 Å through RF discharge.

The deposition conditions of the semiconductor layer 9 described above are shown merely as one example. For example, the semiconductor layer 9 may also be of n-i-p structure or tandem structure. The primary material of the semiconductor layer 9 may not only be amorphous silicon hydride but also amorphous silicon, multi-crystal or microcrystal silicon, or a combination thereof. Also, silicon may be replaced by silicon carbide, silicon germanium, germanium, Groups III–V compound semiconductors, Groups II–VI compound semiconductors, Groups I–III–VI compound semiconductors, or the like. Furthermore, it may be replaced by a combination of these compound semiconductors.

An electrically conductive layer 11 is then deposited on the semiconductor layers 9 via sputtering without conducting a cleaning process. Specifically, the substrate 3 on which the semiconductor layers 9 are deposited is introduced into a sputter chamber which is then exhausted to a high vacuum of $1\times10^{-6}$ Torr or higher. Argon gas (Ar) is introduced into the sputter chamber as a sputter gas, and a layer of ZnO doped with aluminum oxide ($Al_2O_3$) is then deposited to a thickness of 800 to 1000 Å under a pressure of 1 to 5 mtorr through RF discharge. The material of the electrically conductive layer 11 may also be a transparent electrically conductive material such as $SnO_2$ or ITO, or a metal such as Al, Ag, or Cr, instead of ZnO. Furthermore, it may be a laminate of these materials. What is important is that the electrically conductive layer 11 is sequentially deposited on the semiconductor layers 9 without conducting a cleaning process. More preferably, the electrically conductive layer 11 may be deposited sequentially, for example, with a device wherein a CVD chamber is coupled to a sputter chamber, without exposing the semiconductive layer 9 to the atmosphere after the deposition of the semiconductor layer 9.

Subsequently, the semiconductor layer 9 and the electrically conductive layer 11 are melted and segmented simultaneously through the laser scribing technique, to thereby define a plurality of connection openings 7 adjacent to the separation grooves 17 of the first electrode layers 5, which have been already formed. Then, after cleaning of the connection openings 7 in order to remove the debris melted and cut off by the laser scribing, a metal such as Al, Ag, Cr or the like is deposited on the electrically conductive layers 11 as a second electrode layer 13 via sputtering or vacuum vapor deposition. Thereafter, at least the second electrode layer 13, the electrically conductive layer 11, and the n-type microcrystal silicon layer in the vicinity of each of the connection openings 7 at an opposite side of the separation groove 17 of the first electrode layer 5 with respect to each of the connection openings 7 are removed through the laser scribing technique to thereby form an upper separation groove 19 so that a plurality of power generation regions are formed. With this arrangement, a plurality of unit elements 15 each consisting of a region which is interposed between the first electrode layer 5 and the second electrode layer 13 are connected in series and formed on the substrate 3.

Finally, cleaning of the unit elements 15 is conducted in order to remove the debris melted and cut off by laser-scribing, and as occasion demands, an appropriate passivation layer made of epoxy resin or the like is coated on the final product.

Second Embodiment

The processes through the deposition of the semiconductor layer 9 are conducted by the same procedures as the above mentioned first embodiment. Then, an electrically conductive layer 11 is sequentially deposited via sputtering on the semiconductor layer 9 without conducting a cleaning process. Specifically the substrate 3 on which the semiconductor layers 9 are deposited is introduced into a sputter chamber which is then exhausted to a high vacuum of $1\times10^{-6}$ Torr or higher. Argon gas (Ar) is introduced into the sputter chamber as a sputter gas, and a layer of ZnO doped with aluminum oxide ($Al_2O_3$) is then deposited to a thickness of approximately 500 Å under a pressure of 1 to 5 mtorr through RF discharge. The material of the electrically conductive layer 11 may also be a transparent electrically conductive material such as $SnO_2$ or ITO, or a laminate of these materials instead of ZnO. As in the above, what is important is that the electrically conductive layer 11 is sequentially deposited on the semiconductor layers 9 without conducting a cleaning process. More preferably, the electrically conductive layer 11 may be deposited sequentially, for example, within a device where a CVD chamber is coupled to a sputter chamber, without exposing the conductive layer 11 to the atmosphere after the deposition of the semiconductor layer 9.

Next, the semiconductor layer 9 and the electrically conductive layer 11 are melted and segmented simultaneously via the laser scribing technique, to thereby define a plurality of connection openings 7 adjacent to the separation grooves 17 of the first electrode layers 5, which have been already formed. Then, after cleaning of the connection openings 7 in order to remove the debris melted and cut off by the laser scribing, a multi-layer film consisting of a transparent electrically conductive layer made of ZnO, $SnO_2$, ITO, or the like and a metal layer made of Al, Ag, Cr or the like is deposited on the electrically conductive layer(s) 11 as a second electrode layer 13 via sputtering or vacuum vapor deposition as in the above. Specifically, the substrate 3 on which the electrically conductive layer(s) 11 is (are) deposited is introduced into a sputter chamber which is then exhausted to a high vacuum of $1\times10^{-5}$ Torr or higher. Ar gas is introduced into the sputter chamber as a sputter gas, and ZnO doped with $Al_2O_3$ is then deposited to a thickness of approximately 500 Å under a pressure of 1 to 5 mtorr through RF discharge. The substrate 3 is then introduced into a sputter chamber which is then exhausted to a high vacuum of $1\times10^{-5}$ Torr or higher. Ar gas is introduced into the sputter chamber as a sputter gas, and Ag is deposited to a thickness of approximately 3000 Å as the metal layer, through RF discharge under a pressure of $1 \times 10^{-5}$ Torr or higher. It is desirable to deposit ZnO and Ag sequentially without breaking vacuum. However, if the vacuum is broken in the chamber, then the layer may be deposited in another chamber or device. Also, the metal layer may be of a multi-layer structure such as a laminate of, for example, Ag and Al, and the thickness may be set to at least 1000 Å or more, depending on the kind of material. Furthermore, the RF sputtering may be replace by DC sputtering.

Thereafter, at least the second electrode layer 13, the electrically conductive layer 11, and the n-type microcrystal silicon layer in the vicinity of each of the connection openings 7 at an opposite side of the separation groove 17 of the first electrode layer 5 with respect to each of the connection openings 7 are removed via laser scribing to thereby form an upper separation groove 19 so that a plurality of power generation regions are formed. With this arrangement, a plurality of unit elements 15 each consisting of a region which is interposed between the first electrode layer 5 and the second electrode layer 13 are connected in series and formed on the substrate 3. Finally, the unit elements 15 are cleaned in order to remove the debris melted and cut off by laser-scribing, and as occasion demands, an appropriate passivation layer made of epoxy resin or the like is coated on the final product.

What is important to this embodiment is that the thickness of ZnO deposited on the semiconductor layer 9 is set to a range of 600 to 1200 Å, preferably, 800 to 1000 Å. This is because light incident from the side of the glass substrate 3 is effectively reflected at the side of the second electrode layer 13 to obtain "a light trapping effect". Hence, in the first embodiment, where the second electrode layer 13 is made only of metal, ZnO as the electrically conductive layer 11 is deposited to a thickness of 800 to 1000 Å. In the second embodiment where the second electrode layer 13 is of a double-layer structure consisting of the transparent electrically conductive layer and the metal layer, ZnO as the electrically conductive layer 11 and ZnO as the second electrically conductive layer 13 are each deposited in a thickness of 500 Å, to provide a total thickness of 1000Å.

The above-mentioned product of the present invention and the conventional product which has been subjected to a cleaning process when the surface of the semiconductor layer was exposed were compared with each other in FF value and conversion efficiency under an artificial solar light of AM 1.5. As a result, the conventional product had a FF value of 0.61 to 0.68 and 7.3 to 9.0% conversion efficiency, whereas the product according to the present invention had a FF value of 0.68 to 0.71 and 8.8 to 10.4% conversion efficiency. Thus, it has been confirmed that the FF value and the conversion efficiency are remarkably improved.

Furthermore, the present invention can obtain the following secondary effects. In general, Ag is high in reflection but not so excellent in adhesion to the underlayer. In the case where Ag is used as the second electrode layer 13 of the solar battery as in the present invention, the Ag contributes to an improvement of the conversion efficiency but the adhesive strength between Ag and the first electrode is weakened. However, the structure of the present invention is largely useful in order to prevent the above problem. The unevenness of the surface of the electrically conductive layer 11 formed on the semiconductor layer 9 is increased, thereby improving the adhesive strength between the electrically conductive layer 11 and the second electrode layer 13 deposited on the conductive layer 11. Then, in the structure in accordance with the present invention, because the semiconductor layer 9 exists on both sides of each connection opening 7, even though the adhesive strength between the first electrode layer 5 and the second electrode layer 13 in the connection opening 7 is weakened, the electrically conductive layer 11 adheres to the second electrode layer 13 with a high adhesive strength on both sides of the connection opening 7, thereby preventing separation between the first electrode layer 5 and the second electrode layer 13 in the connection opening 7. In this example, the surface of the first electrode layer 5 is roughened. However, when the unevenness of the surface of the first electrode layer 5 is increased, because the thickness of the semiconductor layer 9 is only 3000 to 4000 Å, there is a high risk of increasing leakage current flowing between the first electrode layer 5 and the second electrode layer 13. Hence, such roughening is undesirable. However, the unevenness of the surface of the electrically conductive layer 11 can contribute to irregular reflection of incident light at the second electrode layer 13 side, and is useful in causing the above-mentioned "light trapping effect".

The structure in which the second electrode layer 13 of the present invention is a double-layer structure consisting of the transparent electrically conductive film and the metal layer is disclosed in Japanese Patent Examined Publication No. Sho 60-41878. However, the primary object of the structure disclosed in that publication is completely different from that of the present invention. Also, such a structure does not contribute to an improvement in the adhesive strength between the first electrode layer 5 and the second electrode layer 13 from its structural viewpoint.

As was described above, the present invention provides excellent advantages stated below.

The thin-film solar battery of the present invention is of the structure in which the connection opening can be formed by the laser scribing technique after the semiconductor layer and the electrically conductive layer are sequentially deposited since the electrically conductive layer is formed on the semiconductor layer except for the region of the connection opening. That is, the thin-film solar battery of the invention is of a structure such that it can be manufactured without the semiconductor layer being in direct contact with water used for cleaning or external air, which is different from the conventional thin-film solar battery. Hence, in the integrated thin-film solar battery of the present invention, because a natural oxide film formed during the cleaning process is not generated on the surface of the semiconductor layer, the FF value is remarkably improved in comparison with the conventional integrated thin-film solar battery, thereby realizing a remarkable improvement of the conversion efficiency.

When the electrically conductive layer is made of a transparent electrically conductive film material such as $SnO_2$, ZnO, or ITO, a natural oxide film is not produced on its surface by the cleaning process, and the interface between the electrically conductive layer and the second electrode layer is also held in an excellent state. Furthermore, because alloying does not occur between the electrically conductive layer and the semiconductor layer, factors that lead to the degradation of the FF value can be more completely removed, thereby more surely achieving an improvement in the conversion efficiency.

In the case that a semiconductor layer doped with hydrogen such as an amorphous silicon hydride is used as a semiconductor layer contacting with an electrically conductive layer, the electrically conductive layer contacting with the semiconductor layer is partially reduced because of being composed of a transparent metal oxide material. As a result, the electric connection is improved and the FF value is heightened.

The electrically conductive layer is composed of, not a metal, but a transparent metal oxide material. And, when the electric resistivity of the electrically conductive layer is set in a range of $5\times10^{-4}$ $\Omega\cdot$cm to $4\times10^{-3}$ $\Omega\cdot$cm, ingredients of the electrically conductive layers and the second electrode layers are not mutually diffused so that no alloy is generated and series resistance is kept in a proper level so that factors that lead to the degradation of the FF value are removed.

Also, according to the present invention, because the semiconductor layer exists on both sides of each connection opening where the first electrode layer adheres to the second electrode layer, and even though the unevenness of the surface of the electrically conductive layer is increased, and the adhesive strength between the electrically conductive layer and the second electrode layer deposited thereon is improved, as a result of which even though the adhesive strength between the first electrode layer and the second electrode layer in the connection opening is weakened, the electrically conductive layer adheres to the second electrode layer with a high adhesive strength on both sides of the connection opening, thereby preventing separation between the first electrode layer and the second electrode layer in the connection opening. Hence, the thin-film solar battery in accordance with the present invention is excellent from the viewpoint of reliability.

Furthermore, when the transparent electrically conductive material is used for the electrically conductive layer, light incident from the substrate side is effectively reflected on the second electrode layer side, thereby obtaining the "light trapping effect" and contributing to an improvement in output current.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An integrated thin-film solar battery having a plurality of unit elements connected in series, comprising:
   a substrate;
   a plurality of spaced apart electrode layers formed on the substrate by segmenting a single electrode layer into individual layers, wherein each of the plurality of electrode layers is the first layer of the plurality of unit elements;
   a photoelectric conversion semiconductor layer disposed on each of said plurality of first electrode layers in such a manner that each of the semiconductor layers is formed on two adjacent first electrode layers:
   a transparent electrically conductive layer formed sequentially on each of the semiconductor layers after forming each of the semiconductor layers, said electrically conductive layer comprising a transparent metal oxide material:
   a connection opening formed through the electrically conductive layer and the semiconductor layer to expose a part of each of the first electrode layers; and
   a second electrode layer comprising a metal layer disposed directly on each of the transparent electrically conductive layers such that the second electrode layer is electrically connected to one of two adjacent first electrode layers through the connection opening on the unit element.

2. An integrated thin-film solar battery as claimed in claim 1, wherein the electric resistivity of the transparent electrically conductive layers comprising the transparent metal oxide material is set in a range of $5\times10^{-4}$ $\Omega$cm to $4\times10^{-3}$ $\Omega$cm.

3. An integrated thin-film solar battery as claimed in claim 1, wherein the transparent electrically conductive layers are formed without being exposed to water or external air after forming said photoelectric conversion semiconductor layer.

4. An integrated thin-film solar battery as claimed in claim 1, wherein said electrically conductive layer has a thickness in a range of 600 Å to 1200Å.

5. An integrated thin-film solar battery having a plurality of unit elements connected in series, comprising:
   a substrate;
   a plurality of spaced apart first electrode layers formed on the substrate by segmenting a single electrode layer into individual layers, wherein each of the plurality of electrode layers is the First layer of the plurality of unit elements;
   a photoelectric conversion semiconductor layer disposed on each of said plurality of first electrode layers in such a manner that each of the semiconductor layers is formed on two adjacent first electrode layers;
   a transparent electrically conductive layer formed sequentially on each of the semiconductor layers after forming each of the semiconductor layers, said electrically conductive layer comprising a transparent metal oxide material;
   a connection opening formed through the electrically conductive layer and the semiconductor layer to expose a part of each of the first electrode layers; and
   a second electrode layer comprising a transparent metal oxide layer in direct contact with the transparent electrically conductive layers and a metal layer formed on the transparent metal oxide layer, said second electrode layer being electrically connected to one of two adjacent first electrode layers through the connection opening on the unit element.

6. An integrated thin-film solar battery as claimed in claim 5, wherein the second electrode layer is formed by depositing a metal layer comprising silver in a vacuum state after depositing a transparent metal oxide layer comprising zinc oxide.

7. An integrated thin-film solar battery as claimed in claim 5, wherein the electric resistivity of the transparent electrically conductive layers comprising the transparent metal oxide material is set in a range of $5\times10^{-4}$ $\Omega$cm to $4\times10^{-3}$ $\Omega$cm.

8. An integrated thin-film solar battery as claimed in claim 5, wherein the transparent electrically conductive layers are formed without being exposed to water or external air after forming said photoelectric conversion semiconductor layer.

9. An integrated thin-film solar battery as claimed in claim 5, wherein the total thickness of a transparent metal oxide layer within the transparent electrically conductive layer and said second electrode layer is set in a range of 600 Å to 1200Å.

10. An integrated thin-film solar battery as claimed in claim 5, wherein the transparent metal oxide material of the transparent electrically conductive layers and the transparent metal oxide layer of the second electrode layer comprise zinc oxide.

11. An integrated thin-film solar battery as claimed in claim 10, wherein the metal layer of the second electrode layer comprises silver.

12. An integrated thin-film solar battery as claimed in claim 5, wherein the photoelectric conversion semiconductor layers are doped with hydrogen.

13. A method of manufacturing an integrated thin-film solar battery having a plurality of unit elements connected in series, comprising the steps of:

forming on a substrate a plurality of spaced electrode layers by segmenting a single electrode layer into individual layers, wherein each of the plurality of electrode layers is the first layer of the plurality of unit elements;

forming over said plurality of electrod[0085] layers, a plurality of photoelectric conversion semiconductor layers and a plurality of electrically conductive layers comprising a transparent metal oxide material, the semiconductor and electrically conductive layers being deposited sequentially;

forming a connection opening from the first electrode layer through to the electrically conductive layer that exposes a part of each first electrode layer by patterning each photoelectric conversion semiconductor layer and each transparent electrically conductive layer; and forming a second electrode layer, comprising a metal layer, directly on the transparent electrically conductive layer to connect the plurality of unit elements in series through the connection opening.

14. A method of manufacturing a integrated thin-film solar battery as claimed in claim 13, wherein the thickness of the transparent electrically conductive layers is set in a range of 600 Å to 1200Å.

15. A method of manufacturing an integrated thin-film solar battery as claimed in claim 13, wherein the photoelectric conversion semiconductor layers are doped with hydrogen.

16. A method of manufacturing a integrated thin-film solar battery as claimed in claim 13, wherein the electric resistivity of the transparent electrically conductive layers comprising toe transparent metal oxide material is set in a range of $5 \times 10^{-4}$ Ωcm to $4 \times 10^{-3}$ Ωcm.

17. A method of manufacturing an integrated thin-film solar battery as claimed in claim 13, wherein the transparent electrically conductive layers are formed without being exposed to water or external air after forming said photoelectric conversion semiconductor layers.

18. A method of manufacturing an integrated thin-film solar battery having a plurality of unit elements connected in series, comprising the steps of:

forming on a substrate a plurality of spaced first electrode layers by segmenting a single electrode layer into individual layers, wherein each of the plurality of electrode layers is the first layer of the plurality of unit elements;

forming over each of said plurality of first electrode layers, a photoelectric conversion semiconductor layer and a transparent electrically conductive layer comprising a transparent metal oxide material, the semiconductor layer and electrically conductive layer being deposited sequentially;

forming a connection opening from the first electrode layer through to the electrically conductive layer that exposes a part of each first electrode layer by patterning the photoelectric conversion semiconductor layer and the transparent electrically conductive layer; and forming a second electrode layer, comprising a transparent metal oxide layer in direct contact with the transparent electrically conductive layer and a metal layer formed on the transparent metal oxide layer to connect the plurality of unit elements in series through the connection openings.

19. A method of manufacturing an integrated thin-film solar battery as claimed in claim 18, wherein the transparent metal oxide material of the transparent electrically conductive layers and the transparent metal oxide layer of the second electrode layer comprise zinc oxide.

20. A method of manufacturing an integrated thin-film solar battery as claimed in claim 19, wherein the metal layer of the second electrode layer comprises silver.

21. A method of manufacturing an integrated thin-film solar battery as claimed in claim 18, wherein the second electrode layer is formed by depositing a metal layer comprising silver in a vacuum state after depositing a transparent metal oxide layer comprising zinc oxide.

22. A method of manufacturing an integrated thin-film solar battery as claimed in claim 18, wherein the total thickness of transparent metal oxide layers within the transparent electrically conductive layer and said second electrode layer is set in a range of 600 Å to 1200Å.

* * * * *

UNITED STATES PATENT AND TRADEMARK OFFICE
CERTIFICATE OF CORRECTION

PATENT NO.    : 6,437,231 B2
DATED         : August 20, 2002
INVENTOR(S)   : Shinichiro Kurata et al.

It is certified that error appears in the above-identified patent and that said Letters Patent is hereby corrected as shown below:

<u>Column 13,</u>
Line 18, "electrode[0085]" should be corrected so as to read as -- electrode --.
Lines 33 and 41, "a integrated" should be correct so as to read as -- an integrated --.

Signed and Sealed this

First Day of April, 2003

JAMES E. ROGAN
*Director of the United States Patent and Trademark Office*